(12) United States Patent
Liew et al.

(10) Patent No.: US 9,349,635 B2
(45) Date of Patent: May 24, 2016

(54) INTEGRATED CIRCUITS AND METHODS OF FORMING THE SAME WITH MULTI-LEVEL ELECTRICAL CONNECTION

(71) Applicant: GLOBALFOUNDRIES, Inc., Grand Cayman (KY)

(72) Inventors: San Leong Liew, Mechanicville, NY (US); Huang Liu, Mechanicville, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/770,464

(22) Filed: Feb. 19, 2013

(65) Prior Publication Data

US 2014/0232010 A1    Aug. 21, 2014

(51) Int. Cl.
*H01L 21/768* (2006.01)
*H01L 23/532* (2006.01)
*H01L 23/522* (2006.01)

(52) U.S. Cl.
CPC ...... *H01L 21/76816* (2013.01); *H01L 23/5228* (2013.01); *H01L 23/53295* (2013.01); *H01L 23/5226* (2013.01); *H01L 2924/0002* (2013.01)

(58) Field of Classification Search
CPC .................. H01L 21/76877; H01L 21/76838
USPC ........................... 438/622, 675; 257/379, 528
See application file for complete search history.

(56) References Cited

U.S. PATENT DOCUMENTS 7,768,099 B2 *   8/2010   Oates et al. ................ 257/532

* cited by examiner

*Primary Examiner* — Yu-Hsi D Sun
(74) *Attorney, Agent, or Firm* — Ingrassia Fisher & Lorenz, P.C.

(57) ABSTRACT

Integrated circuits and methods of forming integrated circuits are provided. A method of forming an integrated circuit includes providing a substrate that includes an electrical contact disposed therein. A first dielectric layer is formed over the substrate and electrical contact. A metal-containing layer is patterned over the first dielectric layer, with at least a first portion of the patterned metal-containing layer disposed over the first dielectric layer. The patterned metal-containing layer is absent in regions of the first dielectric layer over the electrical contact. A second dielectric layer is formed over the patterned metal-containing layer. A first via is etched in the first dielectric layer and the second dielectric layer over the electrical contact, and a second via is etched in the second dielectric layer over the patterned metal-containing layer. The first via and the second via are filled with an electrically-conductive material.

13 Claims, 4 Drawing Sheets

INTEGRATED CIRCUITS AND METHODS OF FORMING THE SAME WITH MULTI-LEVEL ELECTRICAL CONNECTION

TECHNICAL FIELD

The technical field generally relates to integrated circuits and methods of forming the integrated circuits with electrical connections to elements at different levels within the integrated circuit, and more particularly relates to integrated circuits and methods of forming the integrated circuits with reliable electrical connection to an electrical contact and a metal-containing layer that is at a different level within the integrated circuit than the electrical contact.

BACKGROUND

Integrated circuits have been pivotal to accelerating progress in electronic device performance, enabling device sizes to shrink without sacrificing performance. Integrated circuits have been widely adopted for electronic devices, as opposed to designs using discrete transistors, due to various capabilities that are enabled by the integrated circuits. For example, integrated circuits can be readily mass produced, generally exhibit excellent reliability, and enable a building-block approach to circuit design.

Integrated circuits generally include a semiconductor substrate including a device, such as a transistor, disposed therein. In fact, modern integrated circuits may contain millions of transistors disposed therein. Layers of dielectric materials are formed over the semiconductor substrates and may include additional devices embedded therein (such as DRAM devices). During fabrication of the integrated circuits, electrical connections to the transistors and the additional devices that are embedded in the integrated circuit are generally formed for purposes of completing electrical routing in the circuit. The electrical connections between the devices in the integrated circuit are formed in the layers of dielectric materials through known techniques of selective etching through the layers of dielectric material to form vias that uncover a contact surface of the transistors and additional devices, followed by filling the vias with electrically-conductive material to form the electrical connections. Under some circumstances, configuration of the transistors and additional devices may be such that a direct path through the layers of dielectric materials for via formation is presented for transistors or additional devices that are at different levels within the integrated circuit. While it would be desirable to etch vias to the contact surfaces of the transistors or additional devices that are at different levels, the contact surfaces that are to be uncovered by the respective vias typically lie on different, parallel planes within the integrated circuit. Because etching generally proceeds at constant rates for via formation, "via punch-through" often occurs at shallower contact surfaces, especially when the shallower contact surfaces include a surface of a thin metal-containing layer. "Via punch-through" refers to propagation of the via completely through the thin metal-containing layer. Via punch-through results in ineffective electrical connection upon subsequent filling of the vias with electrically-conductive material, and may compromise the integrity of the integrated circuit by etching through layers that are unintended to be etched.

Accordingly, it is desirable to provide integrated circuits and methods of forming integrated circuits that enable electrical connection to different devices within the integrated circuit while avoiding via punch-through. In addition, it is desirable to provide integrated circuits and methods of forming integrated circuits that avoid via punch-through without compromising insulation of the electrical connections from each other. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods of forming integrated circuits are provided herein. In an embodiment, a method of forming an integrated circuit includes providing a substrate that includes an electrical contact disposed in the substrate. A first dielectric layer is formed over the substrate and the electrical contact. A metal-containing layer is patterned over the first dielectric layer to form a patterned metal-containing layer, with at least a first portion of the patterned metal-containing layer disposed over the first dielectric layer. The patterned metal-containing layer is absent in regions of the first dielectric layer over the electrical contact. A second dielectric layer is formed over the patterned metal-containing layer. A first via is etched in the first dielectric layer and the second dielectric layer over the electrical contact, and a second via is etched in the second dielectric layer over the patterned metal-containing layer. The electrical contact defines a bottom of the first via and the patterned metal-containing layer defines a bottom of the second via. The first via and the second via are filled with an electrically-conductive material to form a first interconnect in electrical communication with the electrical contact and a second interconnect in electrical communication with the patterned metal-containing layer.

In another embodiment of a method of forming an integrated circuit, a substrate is provided that includes an electrical contact disposed in the substrate. A first dielectric layer is formed over the substrate and the electrical contact. A metal-containing layer is patterned over the first dielectric layer to form a patterned metal-containing layer. At least a first portion of the patterned metal-containing layer disposed over the first dielectric layer and a second portion of the patterned metal-containing layer has a landing surface that is generally disposed along a common plane with a contact surface of the electrical contact. The patterned metal-containing layer is absent in regions of the first dielectric layer over the electrical contact. A second dielectric layer is formed over the patterned metal-containing layer. A first via is etched in the first dielectric layer and the second dielectric layer over the electrical contact, and a second via is concurrently etched, along with the first via, in the second dielectric layer over the patterned metal-containing layer with a first etchant. The first via and the second via are concurrently filled with an electrically-conductive material to form a first interconnect in electrical communication with the electrical contact and a second interconnect in electrical communication with the patterned metal-containing layer.

In another embodiment, an integrated circuit includes a substrate that includes an electrical contact that is disposed in the substrate. A first dielectric layer is disposed over the substrate and the electrical contact. A patterned metal-containing layer is disposed over the first dielectric layer. At least a first portion of the patterned metal-containing layer is disposed over the first dielectric layer. The patterned metal-containing layer is absent in regions of the first dielectric layer over the electrical contact. A second dielectric layer is disposed over the patterned metal-containing layer and over regions of the first dielectric layer that are free from the patterned metal-containing layer. A first via is defined in the first dielectric layer and the second dielectric layer over the electrical contact, and a second via is defined in the second dielectric layer over the patterned metal-containing layer. The electrical contact defines a bottom of the first via and the patterned metal-containing layer defines a bottom of the second via. A first interconnect includes an electrically-conductive material and is disposed in the first via, in electrical communication with the electrical contact. A second interconnect includes the electrically-conductive material and is disposed in the second via, in electrical communication with the patterned metal-containing layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
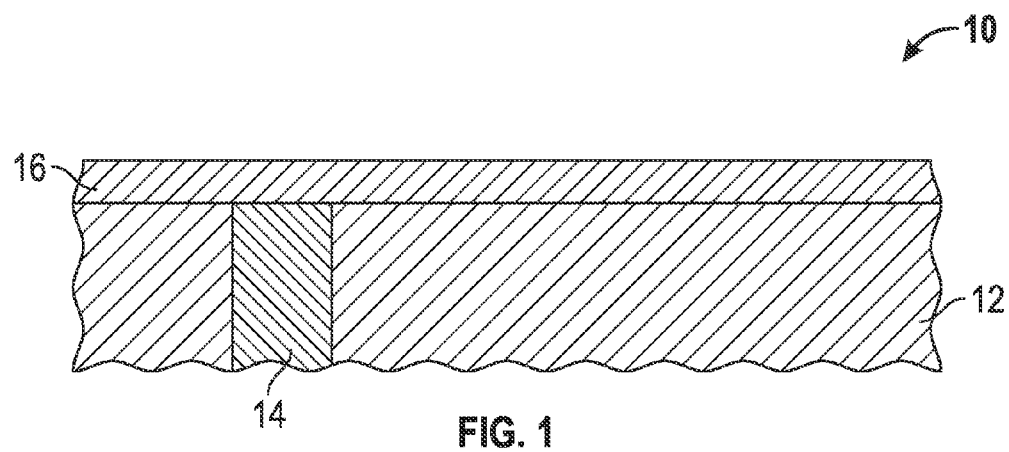
FIG. 1 is a schematic cross-sectional side view of a first dielectric layer formed on a substrate having an electrical contact embedded therein.

The following detailed description is merely exemplary in nature and is not intended to limit the various embodiments or the application and uses thereof. Furthermore, there is no intention to be bound by any theory presented in the preceding background or the following detailed description.

Integrated circuits and methods of forming integrated circuits are provided herein. The integrated circuits include a substrate and an electrical contact disposed in the substrate, although it is to be appreciated that a multitude of electrical contacts may be disposed in the substrate. The electrical contact generally enables electrical connection to a transistor or other device that is disposed on the substrate. A first dielectric layer is disposed over the substrate and the electrical contact, and a metal-containing layer is patterned over the first dielectric layer to form a patterned metal-containing layer, with at least a first portion of the patterned metal-containing layer disposed over the first dielectric layer and with the patterned metal-containing layer absent in regions of the first dielectric layer over the electrical contact. In this manner, at least the first portion of the patterned metal-containing layer is disposed over the first dielectric layer such that the first portion of the patterned metal-containing layer and the electrical contact in the substrate are at different levels within a stack that includes the substrate, first dielectric layer, and the patterned metal-containing layer. A first via is etched over the electrical contact and a second via is etched over the patterned metal-containing layer, and the first via and the second via are filled with an electrically-conductive material to form a first interconnect in electrical communication with the electrical contact and a second interconnect in electrical communication with the patterned metal-containing layer. In accordance with the methods described herein, electrical connection to the electrical contact and the patterned metal-containing layer is possible while avoiding via punch-through of the second via through the patterned metal-containing layer. In particular, in an embodiment and as described in further detail below, punch-through of the second via through the patterned metal-containing layer can be accomplished by recessing a second portion of the patterned metal-containing layer into the first dielectric layer and partially into the substrate to provide a landing surface of the second portion for the second via at substantially the same depth as a contact surface of the electrical contact such that neither the contact surface nor the landing surface are exposed to excessive etching for extended periods of time. In another embodiment and as also described in further detail below, the entire patterned metal-containing layer is disposed over the first dielectric layer such that the entire patterned metal-containing layer is on a different plane than the contact surface of the electrical contact, and an etch-stop layer is formed and patterned along with the metal-containing layer to prevent over-etching of the patterned metal-containing layer while still enabling the first via to be properly etched, followed by etching through the etch-stop layer. Through the aforementioned embodiments, insulation of the first interconnect and the second interconnect remains robust while still avoiding via punch-through due to configuration of the second portion of the patterned metal-containing layer.

An exemplary embodiment of a method of forming an integrated circuit 10 will now be addressed with reference to FIGS. 1-6. Referring to FIG. 1, a substrate 12 is provided, upon which layers of dielectric material are formed as described in further detail below. The substrate 12 includes an electrical contact 14 that is disposed in the substrate 12, and the substrate 12 may include millions of electrical contacts 14. In this regard, the electrical contacts 14 may be formed with nanometer-scale dimensions, e.g., with dimensions less than $1\times10^{-6}$ mm, although scale of the electrical contacts 14 and/or other features is not limited within the integrated circuits that are described herein. Suitable materials that may be used to form the electrical contacts 14 include, but are not limited to, copper, tungsten, aluminum, silver, gold, other metals, or alloys thereof. As shown in FIG. 1, the substrate 12 is generally represented as a generic material, although in various embodiments it is to be appreciated that the substrate 12 can be a dielectric substrate or a semiconductor substrate, and the substrate 12 as referred to herein may include other layers that are not shown in the Figures. For example, in an embodiment, the substrate 12 may be a dielectric substrate that includes the electrical contact 14 disposed therein. Although not shown, the electrical contact 14 in the substrate 12 may connect through the substrate 12 to devices that are disposed beneath the substrate 12, especially when the substrate 12 is a dielectric substrate. Alternatively, in another embodiment, the substrate 12 may be a semiconductor substrate. Although not shown, the semiconductor substrate may include a device, such as a transistor, capacitor, resistor, or the like, with the electrical contact 14 being in electrical communication with the device.

As also shown in FIG. 1, a first dielectric layer 16 is formed on the substrate 12. The first dielectric layer 16 includes a first dielectric material. In an embodiment, the first dielectric material is an oxide such as, for example, a silicon oxide. Further, the first dielectric material may be a low k or ultra-low k material, with such low k or ultra-low k dielectric materials being known in the art. The first dielectric layer 16 may be formed on the substrate 12 through conventional techniques such as spin coating. In an embodiment, the first dielectric layer 16 is disposed directly upon the substrate 12 and directly over and upon the electrical contact 14 that is disposed in the substrate 12. However, it is to be appreciated that other dielectric layers (not shown) may be disposed between the first dielectric layer 16 and the substrate 12, and the first dielectric layer 16 need not be disposed directly upon the substrate 12.

Figure 2:
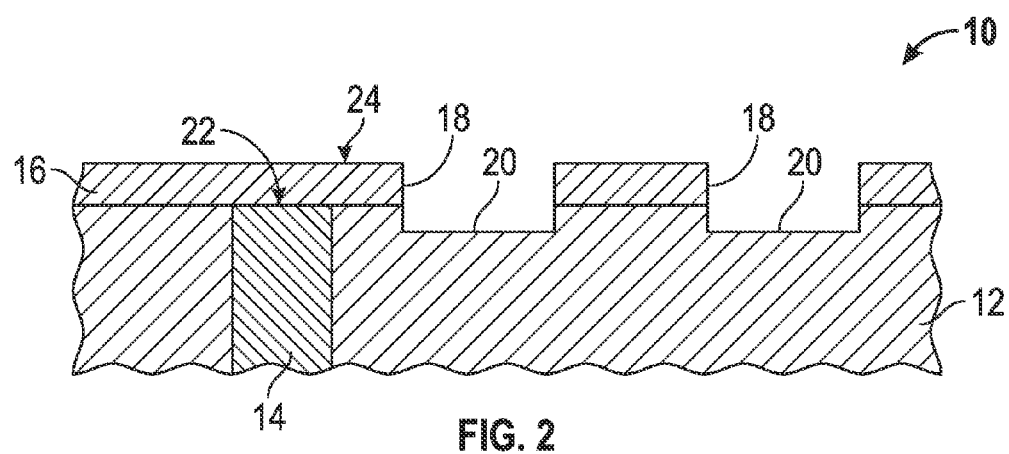
FIGS. 2-6 illustrate in cross-sectional view a portion of an integrated circuit and a method of forming the integrated circuit using the electrical contact of FIG. 1 in accordance with an exemplary embodiment.

In an embodiment and as shown in FIG. 2, a recess 18 is defined through the first dielectric layer 16 and into the substrate 12, with a bottom 20 of the recess 18 defined deeper within the substrate 12 than a contact surface 22 of the electrical contact 14. It is to be appreciated that a plurality of recesses 18 may be formed, as shown in FIG. 2, depending upon desired electrical connection configurations for a metal-containing layer that is described in further detail below. As referred to herein, the "contact surface" is a surface of the electrical contact 14 that is uncovered by a first via, as described in further detail below, and through which the electrical contact 14 is later physically contacted with electrically-conductive material that is filled into the first via. In this embodiment, the recess 18 is patterned through the first dielectric layer 16 and into the substrate 12, such as through etching through the first dielectric layer 16 and the substrate 12, to a distance that is greater than a distance of the contact surface 22 of the electrical contact 14 to a surface 24 of the first dielectric layer 16. Patterning may be conducted through conventional lithography techniques, followed by etching with an appropriate etchant. With the bottom 20 of the recess 18 defined deeper within the substrate 12 than the contact surface 22 of the electrical contact 14, as shown in FIG. 2, a subsequently-formed metal-containing layer may define a landing surface within the recess 18 that is generally disposed along a common plane with the contact surface 22 of the electrical contact 14, as described in further detail below. In an embodiment, a difference in depth between the bottom 20 of the recess 18 and the contact surface 22 of the electrical contact 14 is generally equal to a thickness of the subsequently-formed metal-containing layer. By "generally equal to", it is meant that the recess 18 is desirably etched to provide the difference in depth between the bottom 20 of the recess 18 and the contact surface 22 of the electrical contact 14 equal to the thickness of the subsequently-formed metal-containing layer, with etching process variation, tool limitations, and variations in deposition techniques for forming the metal-containing layer accounting for deviations in the generally equal relationship between the contact surface 22 and the thickness of the subsequently-formed metal-containing layer.

Figure 3:
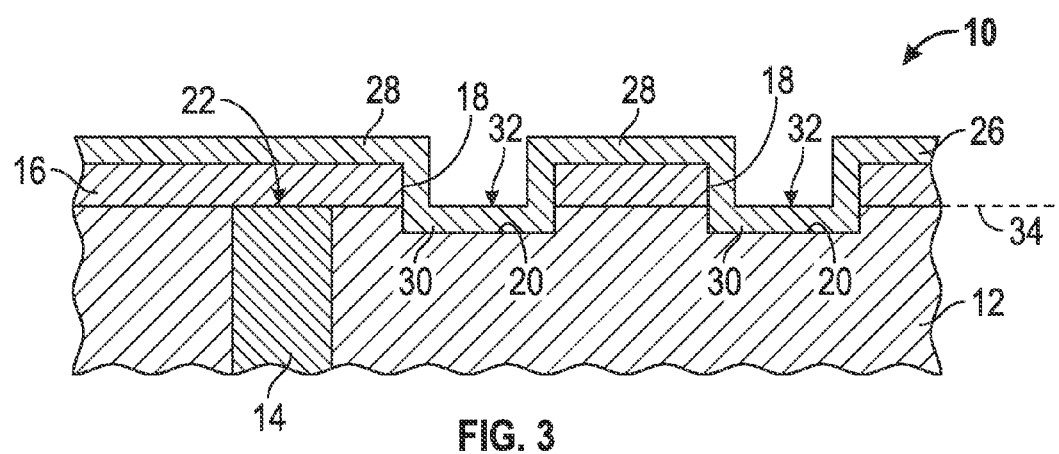

Referring to FIG. 3, the metal-containing layer 26 is formed over the first dielectric layer 16. The metal-containing layer 26 may be a resistive metal-containing layer, and the metal-containing layer 26 may provide functionality to the integrated circuit 10 as a device itself or may be in electrical communication with another device within the integrated circuit 10. For example, the resistive metal-containing layer may function as a resistor, which is a common component in analog or digital input/output circuitry and is commonly incorporated into integrated circuitry designs. The first dielectric layer 16 insulates the metal-containing layer 26 from direct physical contact with the electrical contact 14 that is disposed in the substrate 12. Suitable materials for the metal-containing layer 26 include, but are not limited to, titanium nitride, tungsten silicide, and the like. The metal-containing layer 26 may be formed through conventional metal deposition techniques, such as physical or chemical vapor deposition, sputtering, and the like. The metal-containing layer 26 is formed over the first dielectric layer 16 to provide at least a first portion 28 of the metal-containing layer 26 that is disposed over the first dielectric layer 16. In the embodiment shown in FIG. 3, the metal-containing layer 26 is formed over the first dielectric layer 16 after patterning the recess 18, with a second portion 30 of the metal-containing layer 26 disposed in the recess 18. In this regard, in this embodiment, the recess 18 is defined in a configuration of the second portion 30 of the metal-containing layer 26. As alluded to above, the second portion 30 of the metal-containing layer 26 provides a landing surface 32 that is generally disposed along the common plane 34 with the contact surface 22 of the electrical contact 14. The "landing surface", as referred to herein, is a surface of the metal-containing layer 26 that is uncovered in a second via, as described in further detail below, and through which the metal-containing layer 26 is later physically contacted with electrically-conductive material that is filled into the second via. By "generally disposed", it is meant that the landing surface 32 of the second portion 30 and the contact surface 22 of the electrical contact 14 are desirably disposed along the common plane 34, with variation in etching processes that are employed to form the recess 18, tool limitations, and variations in deposition techniques for forming the metal-containing layer 26 accounting for deviations from achieving the landing surface 32 and the contact surface 22 on the common plane 34. For example, an acceptable deviation from the common plane 34 between the landing surface 32 and the contact surface 22 may be +/−0.005 microns.

Figure 4:
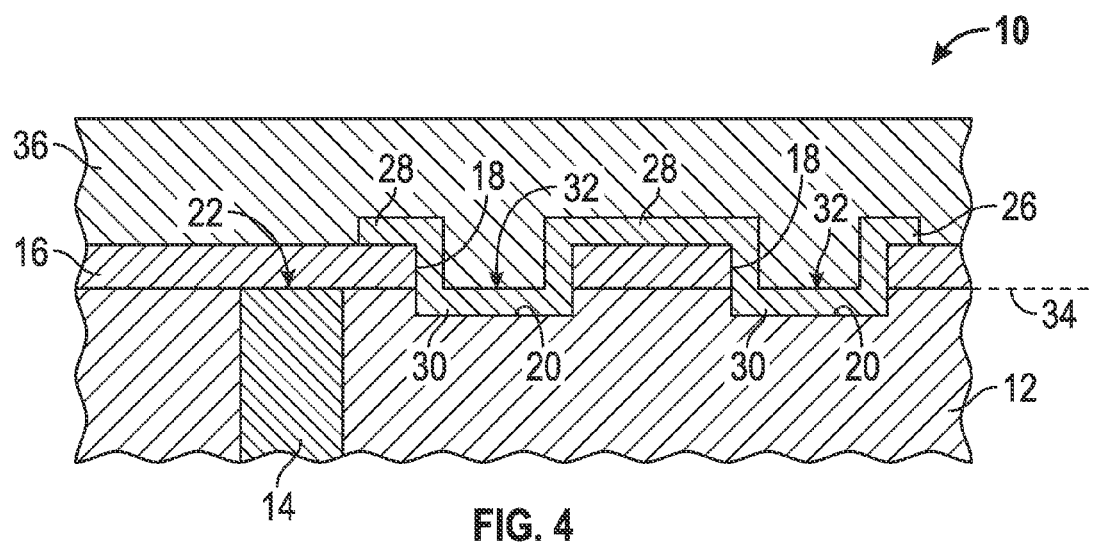

In an embodiment and as shown in FIG. 4, the metal-containing layer 26 is patterned to form a patterned metal-containing layer 26 that is partially disposed over the first dielectric layer 16. The metal-containing layer 26 may be patterned through conventional techniques, such as by patterning a mask (not shown) over the metal-containing layer 26 followed by etching the metal-containing layer 26 through the pattern in the mask. After patterning, at least the first portion 28 of the patterned metal-containing layer 26 is disposed over the first dielectric layer 16, as described above, and the patterned metal-containing layer 26 is absent in regions of the first dielectric layer 16 over the electrical contact 14. The patterned metal-containing layer 26 does not overlap the electrical contact 14, and in embodiments does not overlap any electrical contacts 14 in the substrate 12, such that the first dielectric layer 16 can be vertically etched directly down to the electrical contact 14 without passing through the patterned metal-containing layer 26. Because the recess 18 is patterned through the first dielectric layer 16 and into the substrate 12 in this embodiment prior to patterning the metal-containing layer 26, the resulting patterned metal-containing layer 26 has a multi-level configuration with the second portion 30 of the patterned metal-containing layer 26 still disposed in the recess 18 after patterning.

Again referring to the embodiment shown in FIG. 4, a second dielectric layer 36 is disposed over the patterned metal-containing layer 26 and over regions of the first dielectric layer 16 that are free from the patterned metal-containing layer 26, e.g., regions of the first dielectric layer 16 over the electrical contact 14. In this embodiment, the second dielectric layer 36 is formed after patterning the metal-containing layer 26. The second dielectric layer 36 may be formed from the same or different dielectric material that is employed to form the first dielectric layer 16. In an embodiment, the first dielectric layer 16 and the second dielectric layer 36 are formed from the same nominal dielectric material to provide consistent etch characteristics between the first dielectric layer 16 and the second dielectric layer 36.

Figure 5:
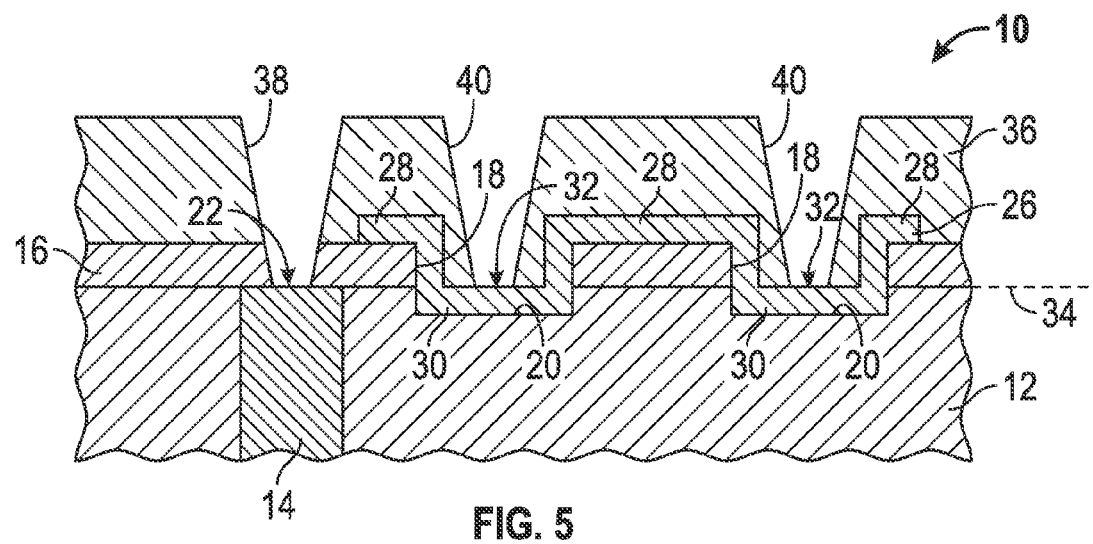

Referring to FIG. 5, a first via 38 is etched in the first dielectric layer 16 and in the second dielectric layer 36 over the electrical contact 14, and a second via 40 is etched in the second dielectric layer 36 over the patterned metal-containing layer 26. As referred to herein, "first vias" are vias that are etched over the contact surface 22 of electrical contacts 14, and "second vias" are vias that are etched over the landing surface 32 of the patterned metal-containing layer 26. In the embodiment shown in FIG. 5, due to the configuration of the patterned metal-containing layer 26 with the first portion 28 and the second portion 30, the second via 40 is etched through the second dielectric layer 36 in the absence of etching through the first dielectric layer 16. In the embodiment shown in FIG. 5, the electrical contact 14 defines a bottom of the first via 38 and the patterned metal-containing layer 26 defines a bottom of the second via 40. In particular, the contact surface 22 of the electrical contact 14 is uncovered by the first via 38 and defines the bottom of the first via 38, and the landing surface 32 of the patterned metal-containing layer 26 is uncovered by the second via 40 and defines the bottom of the second via 40. In this embodiment, the first via 38 and the second via 40 may be concurrently etched, such as by patterning a mask (not shown) in a configuration of the first via 38 and the second via 40, followed by etching through the pattern in the mask.

In an embodiment, the first via 38 and the second via 40 are etched with a first etchant. The first etchant may be any etchant that is effective to etch the first dielectric layer 16 and the second dielectric layer 36. For example, when the first dielectric layer 16 and the second dielectric layer 36 are formed from an oxide, the first etchant may be an oxide etchant such as, but not limited to, $CHF_3$, $CF_4$, or $SF_6$. It is to be appreciated that such etchants are also generally effective to etch the patterned metal-containing layer 26, especially if the patterned metal-containing layer 26 is exposed to the first etchant for extended periods of time, and could result in punch-through of the patterned metal-containing layer 26. However, in this embodiment, with the landing surface 32 of the patterned metal-containing layer 26 generally disposed along the common plane 34 with the contact surface 22 of the electrical contact 14, extended exposure of the landing surface 32 to the first etchant can be avoided while still enabling both the landing surface 32 and the contact surface 22 to be uncovered by etching with the first etchant.

Figure 6:
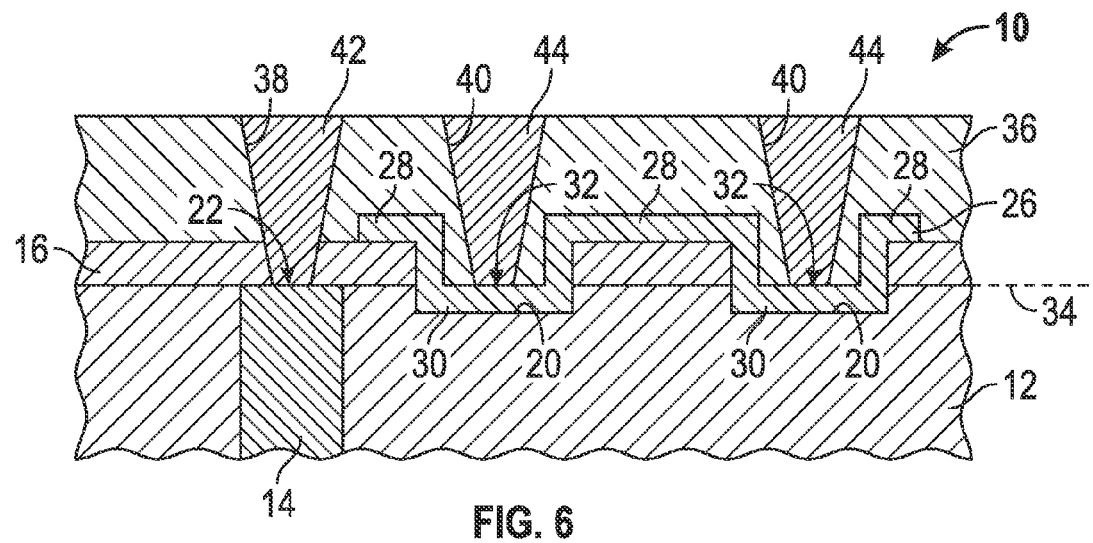

Referring to FIG. 6, after forming the first via 38 and the second via 40, the first via 38 and the second via 40 are filled with an electrically-conductive material to form a first interconnect 42 that is in electrical communication with the electrical contact 14 and a second interconnect 44 that is in electrical communication with the patterned metal-containing layer 26. More specifically, in this embodiment, the first interconnect 42 is disposed in the first via 38 and physically contacts the contact surface 22 of the electrical contact 14, and the second interconnect 44 is disposed in the second via 40 and physically contacts the landing surface 32 of the patterned metal-containing layer 26. In an embodiment, the first via 38 and the second via 40 are concurrently filled with the electrically-conductive material. Suitable electrically-conductive materials that may be employed to form the first interconnect 42 and the second interconnect 44 include, but are not limited to, copper, tungsten, aluminum, silver, gold, other metals, or alloys thereof. Excess electrically-conductive material outside of the first via 38 and the second via 40 may be removed through planarization after filling the first via 38 and the second via 40 with the electrically-conductive material. After forming the first interconnect 42 and the second interconnect 44, it is to be appreciated that further layers may be formed over the second dielectric layer 36, the first interconnect 42, and the second interconnect 44 in accordance with conventional integrated circuit fabrication.

Figure 7:
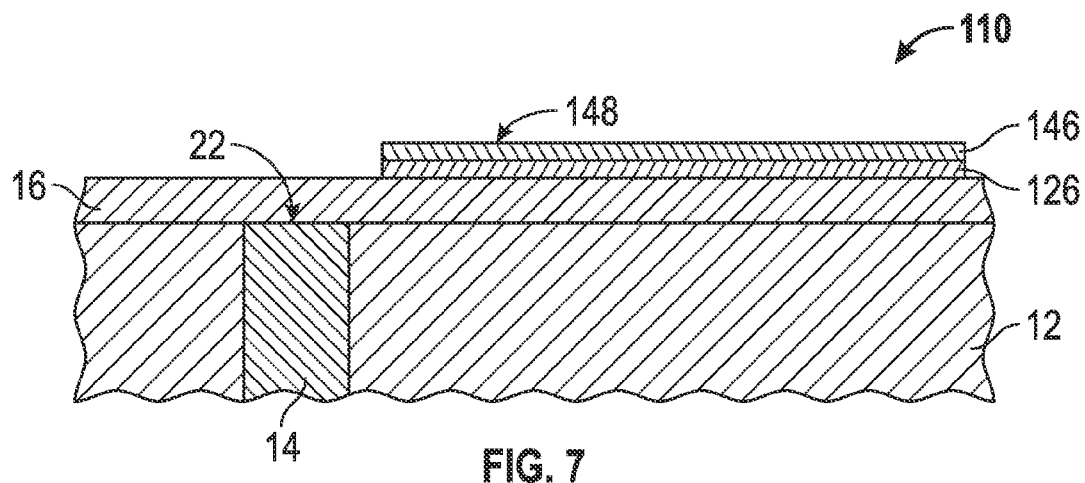
FIGS. 7-11 illustrate in cross-sectional view a portion of an integrated circuit and a method of forming the integrated circuit using the electrical contact of FIG. 1, in accordance with another exemplary embodiment.

Another embodiment of a method of forming an integrated circuit 110 will now be described with reference to FIGS. 1 and 7-11. In this embodiment, the substrate 12 including the electrical contact 14 disposed therein is provided, and the first dielectric layer 16 is formed over the substrate 12 and the electrical contact 14 in the same manner as described above in the context of FIG. 1. However, in this embodiment, no recesses are etched in the first dielectric layer 16 prior to forming a metal-containing layer 126 over the first dielectric layer 16. As a result, in this embodiment and as shown in FIG. 7, the entire metal-containing layer 126 is disposed over the first dielectric layer 16. No portion of the metal-containing layer 126 passes through the first dielectric layer 16 or is disposed beneath the first dielectric layer 16, e.g., on the same side of the first dielectric layer 16 as the electrical contact 14.

Figure 8:
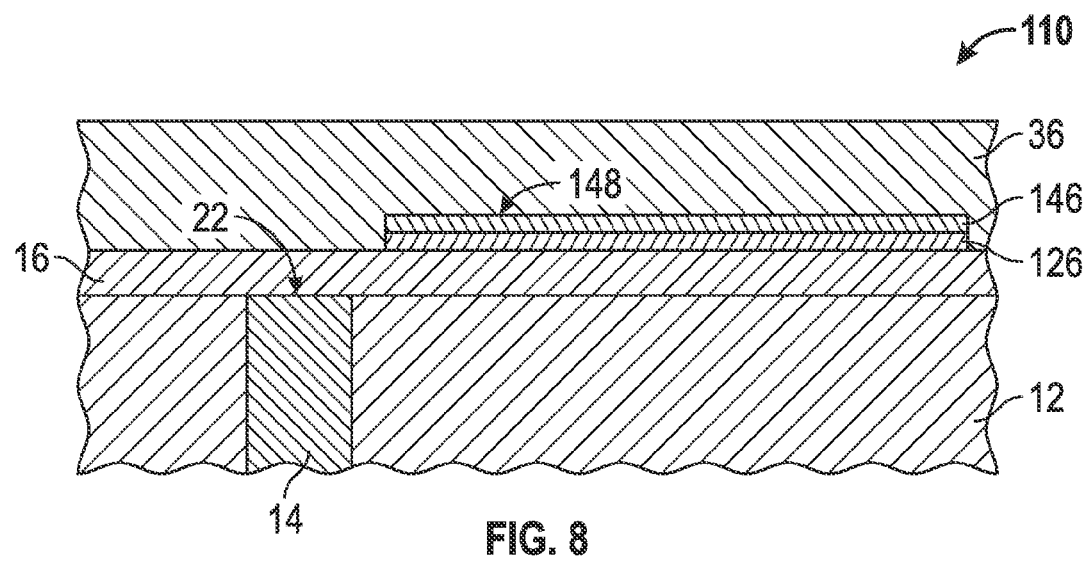

As also shown in FIG. 7, an etch-stop layer 146 is formed over the metal-containing layer 126. Referring momentarily to FIG. 8, a second dielectric layer 36 is deposited overlying etch-stop layer 146, which is now disposed between the metal-containing layer 126 and the second dielectric layer 36 and spaced from contact with the first dielectric layer 16. The etch-stop layer 146 is formed from a material that has a lower etch rate when exposed to the first etchant than the first dielectric layer 16 and the second dielectric layer 36, which enables protection of the metal-containing layer 126 during etching of the first via and the second via as described in further detail below. By "lower etch rate", it is meant that the first etchant and etching technique that is effective to etch the first dielectric layer 16 and the second dielectric layer 36 etches the etch-stop layer 146 at a rate that is measurably slower, such as at least 50 percent slower. Suitable materials for the etch-stop layer 146 are not limited provided that the materials for the etch-stop layer 146 have the lower etch rate when exposed to the first etchant than the first dielectric layer 16 and the second dielectric layer 36. For example, a suitable material for the etch-stop layer 146 is silicon nitride, when the first dielectric layer 16 and the second dielectric layer 36 are formed from an oxide such as silicon dioxide.

Referring again to FIG. 7, the metal-containing layer 126 is patterned in the same manner as described above in the context of FIG. 4, with the metal-containing layer 126 absent in regions of the first dielectric layer 16 that overlie the electrical contact 14. In this embodiment, the etch-stop layer 146 is also absent in regions of the first dielectric layer 16 that overlie the electrical contact 14. In an embodiment, the etch-stop layer 146 and the metal-containing layer 126 are patterned after forming the etch-stop layer 146 over the metal-containing layer 126 such that the etch-stop layer 146 is patterned along with the metal-containing layer 126. However, it is to be appreciated that in other embodiments and although not shown, the etch-stop layer 146 may be formed after patterning the metal-containing layer 126 and separately patterned from the patterned metal-containing layer 126.

As alluded to above and as shown in FIG. 8, the second dielectric layer 36 is disposed over the etch-stop layer 146 and over regions of the first dielectric layer 16 that are free from the etch-stop layer 146 and the patterned metal-containing layer 126, e.g., regions of the first dielectric layer 16 over the electrical contact 14. The second dielectric layer 36 is described above in the context of FIG. 4. In this embodiment, the first dielectric layer 16 and the second dielectric layer 36 may be formed from the same nominal dielectric material to provide consistent etch characteristics between the first dielectric layer 16 and the second dielectric layer 36.

Figure 9:
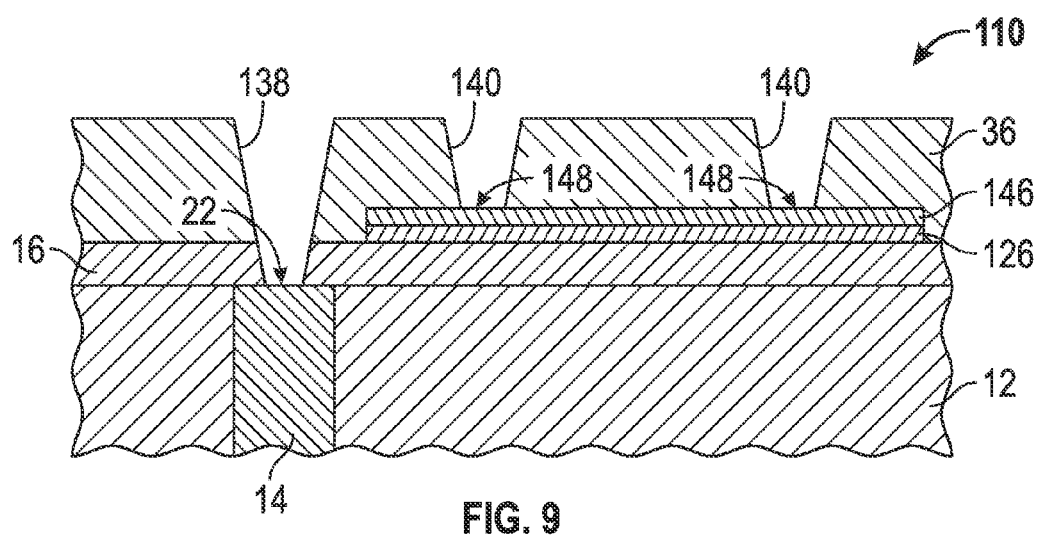
Figure 10:
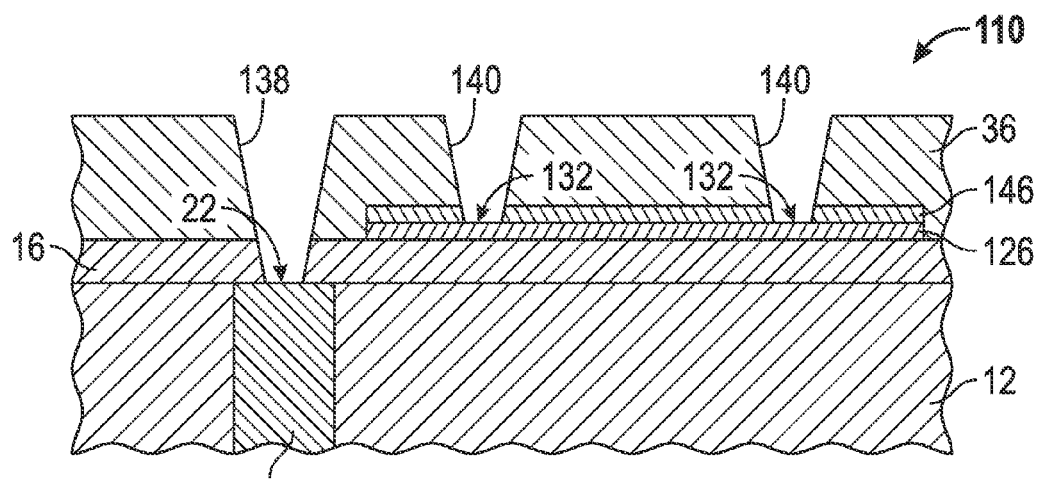

In an embodiment and as shown in FIG. 9, a first via 138 and a second via 140 are etched in a similar manner as described above in the context of FIG. 5 using the first etchant. However, in this embodiment, while the contact surface 22 of the electrical contact 14 is uncovered by the first via 138 after etching with the first etchant, an etch-stop surface 148 of the etch-stop layer 146 is uncovered by the second via 140 due to the lower etch rate of the etch-stop layer 146 when exposed to the first etchant. In this regard, the metal-containing layer 126 is effectively protected from punch-through as a result of etching with the first etchant. Once the contact surface 22 of the electrical contact 14 is uncovered, etching with the first etchant is ceased, with the resultant structure of the first via 138 and the second via 140 shown in FIG. 9. Referring to FIG. 10, after etching with the first etchant, the etch-stop layer 146 in the second via 140 is etched with a second etchant to uncover a landing surface 132 of the patterned metal-containing layer 126 in the second via 140. Suitable second etchants include etchants that etch the etch-stop layer 146 at a higher etch rate than the first etchant and can be readily identified based upon the particular material used for the etch-stop layer 146. For example, when the etch-stop layer 146 includes silicon nitride, suitable second etchants include, but are not limited to, $CHF_3/O_2$ mixtures. All exposed surfaces of the second dielectric layer 36 and contact surface 22 of the electrical contact 14 are generally exposed to the second etchant, along with the etch-stop surface 148 of the etch-stop layer 146. However, because the etch-stop layer 146 is generally thin and etches the etch-stop layer 146 at a higher rate than the first etchant, little etching of the contact surface 22 of the electrical contact 14 or the surface of the second dielectric layer 36 generally occurs.

Figure 11:
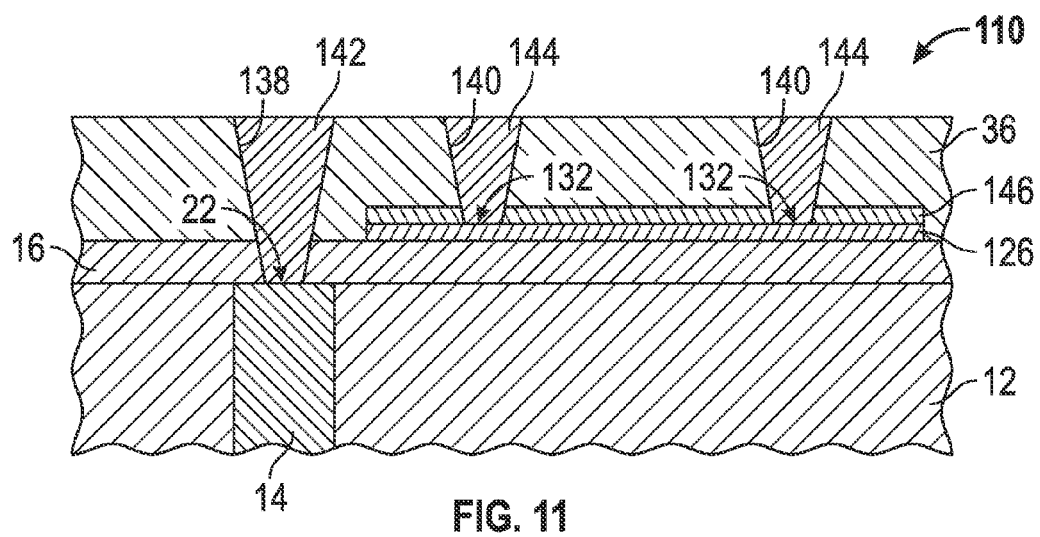

Referring to FIG. 11, once the landing surface 132 of the metal-containing layer 126 is uncovered by the second via 140, the first via 138 and the second via 140 are filled with the electrically-conductive material in the same manner as described above to form the first interconnect 142 and the second interconnect 144. Excess electrically-conductive material may be removed from the second dielectric layer 36 to result in the structure shown in FIG. 11.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit, the method comprising:
   providing a substrate, wherein the substrate comprises an electrical contact disposed therein;
   forming a first dielectric layer over the substrate and the electrical contact;
   patterning a recess through the first dielectric layer and into the substrate;
   patterning a metal-containing layer over the first dielectric layer to form a patterned metal-containing layer, wherein the recess is patterned through the first dielectric layer and into the substrate prior to patterning the metal-containing layer over the first dielectric layer, wherein at least a first portion of the patterned metal-containing layer is disposed over the first dielectric layer, wherein a second portion of the metal-containing layer has a landing surface generally disposed along a common plane with a contact surface of the electrical contact, and wherein the patterned metal-containing layer is absent in regions of the first dielectric layer over the electrical contact;
   forming a second dielectric layer over the patterned metal-containing layer;
   etching a first via in the first dielectric layer and the second dielectric layer over the electrical contact and a second via in the second dielectric layer over the patterned metal-containing layer, wherein the electrical contact defines a bottom of the first via and the patterned metal-containing layer defines a bottom of the second via;
   filling the first via and the second via with an electrically-conductive material to form a first interconnect in electrical communication with the electrical contact and a second interconnect in electrical communication with the patterned metal-containing layer.

2. The method of claim 1, wherein filling the first via and the second via comprises concurrently filling the first via and the second via with the electrically-conductive material.

3. The method of claim 1, wherein etching the first via and the second via comprises etching the first via and the second via with a first etchant.

4. The method of claim 3, wherein the patterned metal-containing layer is a resistive metal-containing layer and wherein patterning the metal-containing layer comprises patterning the resistive metal-containing layer over the first dielectric layer.

5. The method of claim 1, wherein patterning the metal-containing layer comprises forming the metal-containing layer over the first dielectric layer after patterning the recess, with the second portion of the metal-containing layer disposed in the recess.

6. The method of claim 5, wherein etching the first via and the second via comprises etching the first via through the first dielectric layer and the second dielectric layer and etching the second via through the second dielectric layer in the absence of etching through the first dielectric layer.

7. A method of forming an integrated circuit, the method comprising:
   providing a substrate, wherein the substrate comprises an electrical contact disposed therein;
   forming a first dielectric layer over the substrate and the electrical contact;
   patterning a metal-containing layer over the first dielectric layer to form a patterned metal-containing layer, wherein at least a first portion of the patterned metal-containing layer is disposed over the first dielectric layer and wherein a second portion of the patterned metal-containing layer has a landing surface generally disposed along a common plane with a contact surface of the electrical contact, and wherein the patterned metal-containing layer is absent in regions of the first dielectric layer over the electrical contact;
   forming a second dielectric layer over the patterned metal-containing layer;
   concurrently etching a first via in the first dielectric layer and the second dielectric layer over the electrical contact and a second via in the second dielectric layer over the patterned metal-containing layer with a first etchant;
   concurrently filling the first via and the second via with an electrically-conductive material to form a first interconnect in electrical communication with the electrical contact and a second interconnect in electrical communication with the patterned metal-containing layer.

8. A method of forming an integrated circuit, the method comprising:

providing a substrate, wherein the substrate comprises an electrical contact disposed therein;

forming a first dielectric layer over the substrate and the electrical contact;

patterning a metal-containing layer over the first dielectric layer to form a patterned metal-containing layer, wherein at least a first portion of the patterned metal-containing layer is disposed over the first dielectric layer, and wherein the patterned metal-containing layer does not overlap any electrical contacts in the substrate;

forming a second dielectric layer over the patterned metal-containing layer;

etching a first via in the first dielectric layer and the second dielectric layer over the electrical contact and a second via in the second dielectric layer over the patterned metal-containing layer, wherein the electrical contact defines a bottom of the first via and the patterned metal-containing layer defines a bottom of the second via;

filling the first via and the second via with an electrically-conductive material to form a first interconnect in electrical communication with the electrical contact and a second interconnect in electrical communication with the patterned metal-containing layer.

9. The method of claim 8, wherein patterning the metal-containing layer over the first dielectric layer comprises patterning the metal-containing layer, wherein the entire patterned metal-containing layer is disposed over the first dielectric layer.

10. The method of claim 9, further comprising forming an etch-stop layer over the patterned metal-containing layer prior to forming the second dielectric layer over the patterned metal-containing layer, with the etch-stop layer disposed between the patterned metal-containing layer and the second dielectric layer and with the etch-stop layer spaced from contact with the first dielectric layer.

11. The method of claim 10, wherein patterning the metal-containing layer over the first dielectric layer comprises patterning the etch-stop layer and the metal-containing layer after forming the etch-stop layer over the metal-containing layer, wherein the etch-stop layer is absent in regions of the first dielectric layer that overlie the electrical contact.

12. The method of claim 10, wherein the etch-stop layer has a lower etch rate when exposed to the first etchant than the first dielectric layer and the second dielectric layer, and wherein etching the first via and the second via with the first etchant uncovers a contact surface of the electrical contact in the first via and further uncovers an etch-stop surface of the etch-stop layer in the second via.

13. The method of claim 12, wherein etching the first via and the second via further comprises etching the etch-stop layer in the second via with a second etchant to uncovers a landing surface of the patterned metal-containing layer in the second via, wherein the etch-stop layer has a higher etch rate in the second etchant than in the first etchant.

\* \* \* \* \*